(12) United States Patent
Morihara et al.

(10) Patent No.: US 6,271,564 B1
(45) Date of Patent: Aug. 7, 2001

(54) SEMICONDUCTOR DEVICE AND METHOD OF MANUFACTURING THE SAME

(75) Inventors: Toshinori Morihara; Yoshinori Tanaka, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/304,053

(22) Filed: May 4, 1999

(30) Foreign Application Priority Data

Nov. 12, 1998 (JP) ................................................ P10-321897

(51) Int. Cl.⁷ ........................ H01L 31/062; H01L 31/113; H01L 21/3205

(52) U.S. Cl. ........................ 257/344; 438/305; 438/286; 257/336

(58) Field of Search .................................. 438/286, 305; 257/344, 336

(56) References Cited

U.S. PATENT DOCUMENTS

| | | | |
|---|---|---|---|
| 5,200,351 | * | 4/1993 | Hadjizadeh-Amini . |
| 5,225,357 | * | 7/1993 | Ho . |
| 5,472,890 | | 12/1995 | Oda . |
| 5,610,088 | * | 3/1997 | Chang et al. . |
| 5,696,012 | * | 12/1997 | Son . |
| 5,849,622 | * | 12/1998 | Hause et al. .......................... 438/286 |
| 5,904,528 | * | 5/1999 | Lin et al. .............................. 438/286 |
| 5,989,966 | * | 11/1999 | Huang .................................. 438/305 |
| 6,107,145 | * | 8/2000 | Dennison et al. .................... 438/297 |

FOREIGN PATENT DOCUMENTS 5-299394  11/1993 (JP) .
6-97190   4/1994 (JP) .

OTHER PUBLICATIONS

Y. Kohyama, et al. "A Fully Printable, Self–aligned and Planarized Stacked Capacitor DRAM Cell Technology for 1Gbit DRAM and Beyond", 1997 Symposium on VLSI Technology Digest of Technical Papers, pp. 17–18.

T. Ohguro, et al. "0.25 $\mu$m CoSi2 Salicide CMOS Technology Thermally Stable Up to 1,000° C. with High TDDB Reliability", 1997 Symposium on VLSI Technology Digest of Technical Papers, pp. 101–102.

* cited by examiner

Primary Examiner—Richard Booth
(74) Attorney, Agent, or Firm—Oblon, Spivak, McClelland, Maier & Neustadt, P.C.

(57) ABSTRACT

When sidewalls (10) are formed by anisotropic etching, an insulating film (9) serves as a protective film for a major surface of a semiconductor substrate (100) and therefore prevents the major surface from suffering etching damage. That relieves an electric field concentration in a pn junction, to effectively take advantage of an LDD structure. Since a portion of the insulating film (9) extending off the sidewalls (10) is removed, there is no need for etching of the insulating film (9) when the contact holes (12) are formed and only an insulating film (11) is etched. That prevents a short circuit between main electrodes (13) and a gate electrode (7) and makes it possible to determine the spacing between the contact holes (12) narrower than the width of the gate electrode (7).

9 Claims, 14 Drawing Sheets

US 6,271,564 B1

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to an improvement technique for effectively taking advantage of an LDD (Lightly Doped Drain) structure.

2. Description of the Background Art

FIG. 29 is a front cross section showing a structure of a semiconductor device in the background art. A device 151 of this figure comprises a MOSFET (Metal Oxide Semiconductor Field Effect Transistor) and the MOSFET has an LDD (Lightly Doped Drain) structure. In this specification, according to the custom of this art, a transistor is referred to as MOSFET also when its gate electrode is not made of metal.

A semiconductor substrate 150 comprises a p-type well 61. A device isolation layer 64 is selectively buried in a major surface of the semiconductor substrate 150. Further, a pair of $n^+$-type high-concentration semiconductor layers 62 and a shallower pair of $n^-$-type low-concentration semiconductor layers 63 are selectively formed in a portion of the major surface of the semiconductor substrate 150 between the two device isolation layers 64. Respective ones of the paired low-concentration semiconductor layers 63 are formed as if extending off respective ones of the paired high-concentration semiconductor layers 62 towards a portion of the major surface between the paired high-concentration semiconductor layers 62.

In other words, the high-concentration semiconductor layers 62 and the low-concentration semiconductor layers 63 form an LDD structure. The high-concentration semiconductor layers 62 and the low-concentration semiconductor layers 63 correspond to source/drain regions of the MOSFET. An exposed surface layer of the well 61 between the paired high-concentration semiconductor layers 62 corresponds to a channel region CH of the MOSFET.

An insulating film 65 which is a silicon oxide film formed on the major surface of the semiconductor substrate 150, and a gate electrode 67 is so formed as to face the channel region CH on the insulating film 65. An insulating layer 68 is formed on the gate electrode 67. Sidewalls 70 are formed on the sides of the gate electrode 67 and the insulating layer 68.

An insulating layer 71 is so formed as to cover the above-described structure formed above the semiconductor substrate 150. In the insulating layer 71, a pair of contact holes 72 are selectively formed immediately above the pair of high-concentration semiconductor layers 62. Each of the contact holes 72 is filled with a conductive main electrode 73, and a pair of main electrodes 73 are thereby connected to the pair of high-concentration semiconductor layers 62, respectively. An interconnection layer 74 is placed on the insulating layer 71 to be connected to the main electrode 73.

Since the device 151 comprising the MOSFET has the above LDD structure, it is possible to relieve an electric field concentration that takes place in a pn junction between the well 61 and the semiconductor layers 62 and 63. As a result, a hot-carrier effect is suppressed and that increases the lifetime and reliability of the insulating film 65. Further, relieving the electric field concentration in the pn junction suppresses a leak current.

The background-art device 151, however, has a problem that the advantage of the LDD structure can not be fully taken in some cases due to the problematic manufacturing process. FIGS. 30 to 34 are process illustrations showing a method of manufacturing the device 151. The process begins with a step of FIG. 30.

In the step of FIG. 30, the semiconductor substrate 150 is prepared. In the major surface of the semiconductor substrate 150, the p-type well 61 is formed and the device isolation layer 64 is selectively buried therein. By thermal oxidation, the insulating film 76 is formed as a thermal oxide film on the major surface of the semiconductor substrate 150 and thereafter the gate electrode 67 and the insulating layer 68 are formed on the insulating film 76.

Next, as shown in FIG. 31, a pair of low-concentration semiconductor layers 63 are selectively formed. To form the low-concentration semiconductor layers 63, an n-type impurity is selectively implanted into the major surface of the semiconductor substrate 150 by using the gate electrode 67 and the insulating layer 68 as a mask and then diffused.

As shown in FIG. 32, the sidewalls 70 are formed of silicon oxide. A material of the sidewalls 70 is so deposited as to entirely cover an exposed surface above the semiconductor substrate 150 and then the deposited material is selectively removed by RIE (Reactive Ion Etching), to form the sidewalls 70 by such a self-alignment process. In this process, only a portion of the insulating film 76 covered with the gate electrode 67 and the sidewalls 70 is left as the insulating film 65.

After that, as shown in FIG. 33, a pair of high-concentration semiconductor layers 62 are selectively formed in the major surface of the semiconductor substrate 150. To form the high-concentration semiconductor layers 62, an n-type impurity is selectively implanted into the major surface of the semiconductor substrate 150 by using the gate electrode 67, the insulating layer 68 and the sidewalls 70 as a mask and then diffused.

Next, a step of FIG. 34 is executed. In the step of FIG. 34, a material of the insulating layer 71 is so deposited as to entirely cover an exposed surface above the semiconductor substrate 150. After that, contact holes 72 are formed in the deposited material. Referring back to FIG. 29, the contact holes 72 are each filled with a conductive material, to form the main electrodes 73. The interconnection layer 74 is so placed on the insulating layer 71 as to be connected to the main electrode 73. Through the above steps, the device 151 is completed.

Among the above manufacturing process steps, the step of FIG. 32 for forming the sidewalls 70 causes the problem of losing advantage of the LDD structure. This is illustrated in FIG. 35. As shown in FIG. 35, the major surface of the semiconductor substrate 150 is also etched in some cases in a step of anisotropic etching using RIE.

This is caused by forming the insulating film 65 with thickness of only about 7 to 8 nm when the gate electrode 67 has a width of e.g., 0.15 $\mu$m, which is a typical value, (along the channel length, i.e., from one of the paired low-concentration semiconductor layers 63 to the other). When the major surface of the semiconductor substrate 150 is etched, as indicated by the sign "A" of FIG. 35, the edge of the high-concentration semiconductor layer 62 is not fully covered with the low-concentration semiconductor layer 63. As a result, an electric field concentration occurs in the pn junction represented by the sign "A" and the hot-carrier effect is increased. Further, the electric field concentration in the pn junction increases a leak current. As a result, the advantage of using the LDD structure is reduced.

With size reduction of devices, the source/drain region of the MOSFET becomes shallower. Therefore, as devices are downsized more and more, the ill effect of etching damage on the semiconductor substrate 150 in formation of the sidewalls becomes more pronounced.

SUMMARY OF THE INVENTION

The present invention is directed to a semiconductor device. According to a first aspect of the present invention, the semiconductor device comprises: a semiconductor substrate comprising a major surface of a first conductivity type, a pair of low-concentration semiconductor layers of a second conductivity type selectively formed in the major surface separately from each other and a pair of high-concentration semiconductor layers of the second conductivity type selectively formed in the major surface separately from each other, having opposed edges recessed from opposed edges of the pair of low-concentration semiconductor layers, being deeper and higher in concentration than the pair of low-concentration semiconductor layers; a first insulating film formed immediately on the major surface; a gate electrode so formed on the first insulating film as to face a region between the opposed edges of the pair of low-concentration semiconductor layers; a pair of main electrodes connected to the pair of high-concentration semiconductor layers respectively; sidewalls being insulative and covering sides of the gate electrode and a portion of the first insulating film adjacent to the gate electrode; and a second insulating film whose main component is different from that of the sidewalls, covering a surface of the gate electrode except a portion facing the first insulating film so as to isolate the gate electrode from the sidewalls and covering an upper portion of the first insulating film not facing the gate electrode so as to insolate the first insulating film from the sidewalls and not as to extend off the sidewalls.

According to a second aspect of the present invention, the semiconductor device of the first aspect further comprises: a third insulating film whose main component is different from that of the second insulating film, covering the surface of the gate electrode except the portion facing the first insulating film so as to isolate the gate electrode from the second insulating film, isolating the first insulating film from the second insulating film and covering the upper portion of the first insulating film not facing the gate electrode.

According to a third aspect of the present invention, the semiconductor device of the second aspect further comprises: an insulating layer formed above the major surface and selectively defining a pair of contact holes which the pair of main electrodes penetrate respectively, and in the device of the third aspect, the first insulating film, the third insulating film and the insulating layer include the same main component.

Preferably, the semiconductor substrate includes silicon as its main component, the sidewalls, the first insulating film, the third insulating film and the insulating layer include silicon oxide as their main component, and the second insulating film includes silicon nitride as its main component.

According to a fourth aspect of the present invention, the semiconductor device comprises: a semiconductor substrate comprising a major surface of a first conductivity type, a pair of low-concentration semiconductor layers of a second conductivity type selectively formed in the major surface separately from each other and a pair of high-concentration semiconductor layers of the second conductivity type selectively formed in the major surface separately from each other, having opposed edges recessed from opposed edges of the pair of low-concentration semiconductor layers, being deeper and higher in concentration than the pair of low-concentration semiconductor layers; a first insulating film formed immediately on the major surface; a gate electrode so formed on the first insulating film as to face a region between the opposed edges of the pair of low-concentration semiconductor layers; a pair of main electrodes connected to the pair of high-concentration semiconductor layers respectively; sidewalls being insulative and covering sides of the gate electrode and a portion of the first insulating film adjacent to the gate electrode; a second insulating film interposed between the sidewalls and the gate electrode; and a third insulating film whose main component is different from that of the sidewalls, interposed between the sidewalls and the first insulating film.

According to a fifth aspect of the present invention, the semiconductor device of the fourth aspect further comprises: an insulating layer formed above the major surface and selectively defining a pair of contact holes which the pair of main electrodes penetrate respectively, and in the device of the fifth aspect, the first insulating film, the third insulating film and the insulating layer include the same main component.

Preferably, the semiconductor substrate includes silicon as its main component, the first insulating film, the third insulating film and the insulating layer include silicon oxide as their main component, and the second insulating film includes a layer including silicon oxide as its main component at least on a side not facing the gate electrode.

Preferably, the semiconductor substrate includes silicon as its main component, the first insulating film, the third insulating film and the insulating layer include silicon oxide as their main component, and the second insulating film includes a layer including silicon nitride as its main component at least on a side facing the gate electrode.

According to a sixth aspect of the present invention, the semiconductor device of the fourth aspect further comprises: a first insulating layer formed on the gate electrode; and a second insulating layer whose main component is different from that of the sidewalls and said first insulating film, formed above the major surface and selectively defining a pair of contact holes which the pair of main electrodes penetrate respectively.

Preferably, the pair of contact holes are formed with spacing narrower than the width of the gate electrode along a direction from one of the pair of low-concentration semiconductor layers to the other.

The present invention is also directed to a method of manufacturing a semiconductor device. According to a seventh aspect of the present invention, the method comprises the steps of: (a) preparing a semiconductor substrate having a major surface of a first conductivity type; (b) forming a first insulating film on the major surface; (c) forming a gate electrode on the first insulating film; (d) selectively introducing an impurity into the major surface with the gate electrode as a mask to selectively form a pair of low-concentration semiconductor layers in the major surface, being separated from each other with at least a portion of a region immediately below the gate electrode interposed therebetween; (e) forming a second insulating film for covering the gate electrode and the first insulating film at least after the step (c); (f) depositing a material whose main component is different from that of the second insulating film so as to entirely cover an exposed surface above the major surface after the steps (d) and (e); (g) anisotropically etching the material deposited in the step (f) to form sidewalls for covering sides of the gate electrode and a portion of the first insulating film adjacent to the gate electrode; (h) performing a selective etching to selectively remove a portion of the second insulating film existing along the first insulating film and uncovered by the sidewalls; (i) selectively introducing an impurity into the major surface with the gate electrode, the second insulating film and the sidewalls as a mask to selectively form a pair of high-concentration semiconductor layers of a second conductivity type having opposed edges recessed from opposed edges of the pair of low-concentration semiconductor layers, being deeper and higher in concentration than the pair of low-concentration semiconductor layers, in the major surface at least after the step (g); and (j) connecting a pair of main electrodes to the pair of high-concentration semiconductor layers respectively.

According to an eighth aspect of the present invention, the method of the seventh aspect further comprises the step of: (k) forming a third insulating film for covering the gate electrode and the first insulating film by using a material whose main component is different from that of the second insulating film after the step (c) before the step (e).

According to a ninth aspect of the present invention, in the method of the eighth aspect, the third insulating film formed in the step (k) has the same main component as the first insulating film, and the step (j) comprises the steps of: (j-1) depositing a material whose main component is the same as that of the first insulating film entirely on an exposed surface above the major surface to form an insulating layer; (j-2) selectively etching the insulating layer to selectively form a pair of contact holes in portions immediately above a region including a portion of the pair of high-concentration semiconductor layers; and (j-3) filling the pair of contact holes with an electrode material to form the pair of main electrodes.

Preferably, the semiconductor substrate prepared in the step (a) includes silicon as its main component, the first insulating film formed in the step (b), the material deposited in the step (f), the third insulating film formed in the step (k) and the insulating layer formed in the step (j-1) are each include silicon oxide as their main component, and the second insulating film formed in the step (e) includes silicon nitride as its main component.

According to a tenth aspect of the present invention, the method comprises the steps of: (a) preparing a semiconductor substrate having a major surface of a first conductivity type; (b) forming a first insulating film on the major surface; (c) forming a gate electrode on the first insulating film; (d) selectively introducing an impurity into the major surface with the gate electrode as a mask to selectively form a pair of low-concentration semiconductor layers in the major surface, being separated from each other with at least a portion of a region immediately below the gate electrode interposed therebetween; (e) forming a second insulating film on a side surface of the gate electrode at least after the step (c); (f) forming a third insulating film whose main component is different from that of the first insulating film on a portion of the first insulating film uncovered with the gate electrode after the step (e); (g) depositing a material whose main component is different from that of the third insulating film so as to entirely cover an exposed surface above the major surface after the step (f); (h) anisotropically etching the material deposited in the step (g) to form sidewalls for covering sides of the gate electrode and a portion of the first insulating film adjacent to the gate electrode; (i) selectively introducing an impurity into the major surface with the gate electrode and the sidewalls as a mask to selectively form a pair of high-concentration semiconductor layers of a second conductivity type having opposed edges recessed from opposed edges of the pair of low-concentration semiconductor layers, being deeper and higher in concentration than the pair of low-concentration semiconductor layers, in the major surface; and (j) connecting a pair of main electrodes to the pair of high-concentration semiconductor layers respectively.

According to an eleventh aspect of the present invention, in the method of the tenth aspect, the third insulating film formed in the step (f) has the same main component as the first insulating film, and the step (j) comprises the steps of: (j-1) depositing a material whose main component is the same as that of the first insulating film entirely on an exposed surface above the major surface to form an insulating layer; (j-2) selectively etching the insulating layer to selectively form a pair of contact holes in portions immediately above a region including a portion of the pair of high-concentration semiconductor layers; and (j-3) filling the pair of contract holes with an electrode material to form the pair of main electrodes.

Preferably, the semiconductor substrate prepared in the step (a) includes silicon as its main component, the second insulating film formed in said step (e) includes silicon nitride as its main component, and the first insulating film formed in the step (b), the third insulating film formed in the step (f) and the insulating layer formed in the step (j-1) each include silicon oxide as their main component.

Preferably, the third insulating film is formed by thermal oxidation in the step (f).

Preferably, the thermal oxidation is so executed as to leave a layer which includes silicon oxide as its main component in the second insulating film in the step (f).

According to a twelfth aspect of the present invention, the method of the tenth aspect further comprises the step of: (k) forming a first insulating layer on the gate electrode at least before the step (g), and in the method of the twelfth aspect, the step (j) comprises the steps of: (j-1) depositing a material whose main component is different from those of the material deposited in the step (g) and the first insulating layer entirely on an exposed surface above the major surface to form a second insulating layer; (j-2) selectively etching the second insulating layer to selectively form a pair of contact holes in portions immediately above a region including a portion of the pair of high-concentration semiconductor layers; and (j-3) filling the pair of contact holes with an electrode material to form the pair of main electrodes.

Preferably, the pair of contact holes are formed with spacing narrower than the width of the gate electrode along a direction from one of the pair of low-concentration semiconductor layers to the other in the step (j-2).

Since the second insulating film is provided as an underlying layer of the sidewalls in the device of the first aspect, the second insulating film serves as a protective film for the major surface of the semiconductor substrate in the step of performing a selective etching to form the sidewalls in the process for manufacturing the device. This relieves an electric field concentration in a pn junction and the intrinsic advantage of the LDD structure can be effectively taken. Further, since the portion of the second insulating film covering the first insulating film does not extend off the sidewalls, there is no need for removing the second insulating film by etching. Therefore, the main electrodes can be formed with spacing narrower than the width of the gate electrode while the second insulating film prevents a short circuit between the main electrodes and the gate electrode.

Since the third insulating film is provided in the device of the second aspect, it becomes possible to remove the second insulating film without damaging the major surface of the semiconductor substrate in the process for manufacturing the device.

Since the first insulating film, the third insulating film and the insulating layer include the same component as their main component in the device of the third aspect, it is easy to form the contact hole which penetrates the insulating layer.

Since the third insulating film is provided as an underlying layer of the sidewalls in the device of the fourth aspect, the third insulating film serves as a protective film for the major surface of the semiconductor substrate in the step of performing a selective etching to form the sidewalls in the process for manufacturing the device. This relieves an electric field concentration in a pn junction and the intrinsic advantage of the LDD structure can be effectively taken. Further, since the second insulating film is interposed between the sidewalls and the gate electrode, the second insulating film serves as a protective film for the gate electrode in the step of forming the third insulating film before forming the sidewalls. That suppresses thinning of the gate electrode.

Since the first insulating film, the third insulating film and the insulating layer include the same component as their main component in the device of the fifth aspect, it is easy to form the contact hole which penetrates the insulating layer.

In the device of the sixth aspect, a pair of main electrodes are connected to a pair of high-concentration semiconductor layers through the contact holes formed in the second insulating layer whose main component is different from that of the sidewalls and the first insulating layer. Therefore, the contact holes are formed by etching only the second insulating layer with less effect on the sidewalls and the first insulating layer. It is thereby possible to form a pair of contact holes at such a position as to overlap the gate electrode and prevent a short circuit between the main electrodes and the gate electrode even with low accuracy of mask-pattern alignment. Further, it becomes possible to form a pair of main electrodes with spacing narrower than the width of the gate electrode. This facilitates size reduction of the device.

Since the material of the sidewall is deposited on the second insulating film and then selectively etched to form the sidewalls in the manufacturing method of the seventh aspect, the second insulating film serves as a protective film for the major surface of the semiconductor substrate. This relieves an electric field concentration in a pn junction and the intrinsic advantage of the LDD structure can be effectively taken. Further, since the portion of the second insulating film covering the first insulating film is so removed as not to extend off the sidewalls, there is no need for removing the second insulating film by etching when the sidewalls are formed. Therefore, the main electrodes can be formed with spacing narrower than the width of the gate electrode while the second insulating film prevents a short circuit between the main electrodes and the gate electrode.

Since the third insulating film is provided as an underlying layer of the second insulating film in the manufacturing method of the eighth aspect, it becomes possible to remove the second insulating film without damaging the major surface of the semiconductor substrate.

Since the first insulating film, the third insulating film and the insulating layer include the same component as their main component in the manufacturing method of the ninth aspect, it is easy to form the contact hole which penetrates the insulating layer.

Since the material of the sidewall is deposited on the third insulating film and then selectively etched to form the sidewalls in the manufacturing method of the tenth aspect, the third insulating film serves as a protective film for the major surface of the semiconductor substrate. This relieves an electric field concentration in a pn junction and the intrinsic advantage of the LDD structure can be effectively taken. Further, since the second insulating film is formed on the side surface of the gate electrode before forming the third insulating film, the second insulating film serves as a protective film for the gate electrode. That suppresses thinning of the gate electrode.

Since the first insulating film, the third insulating film and the insulating layer include the same component in the manufacturing method of the eleventh aspect, it is easy to form the contact hole which penetrates the insulating layer.

In the manufacturing method of the twelfth aspect, a pair of contact holes to be filled with a pair of main electrodes are formed in the second insulating layer whose main component is different from that of the sidewalls and the first insulating layer. Therefore, the contact holes are formed by etching only the second insulating layer with less effect on the sidewalls and the first insulating layer. It is thereby possible to form a pair of contact holes at such a position as to overlap the gate electrode and prevent a short circuit between the main electrodes and the gate electrode even with low accuracy of mask-pattern alignment. Further, it becomes possible to form a pair of main electrodes with spacing narrower than the width of the gate electrode. This facilitates size reduction of the device.

An object of the present invention is to provide a semiconductor device which suppresses an electric field concentration in a pn junction without losing the advantage of an LDD structure and can thereby effectively suppress a hot-carrier effect and a leak current, and provide a method of manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. The First Preferred Embodiment>

First, a semiconductor device of the first preferred embodiment will be discussed.

<1-1. Device Structure>

Figure 1:
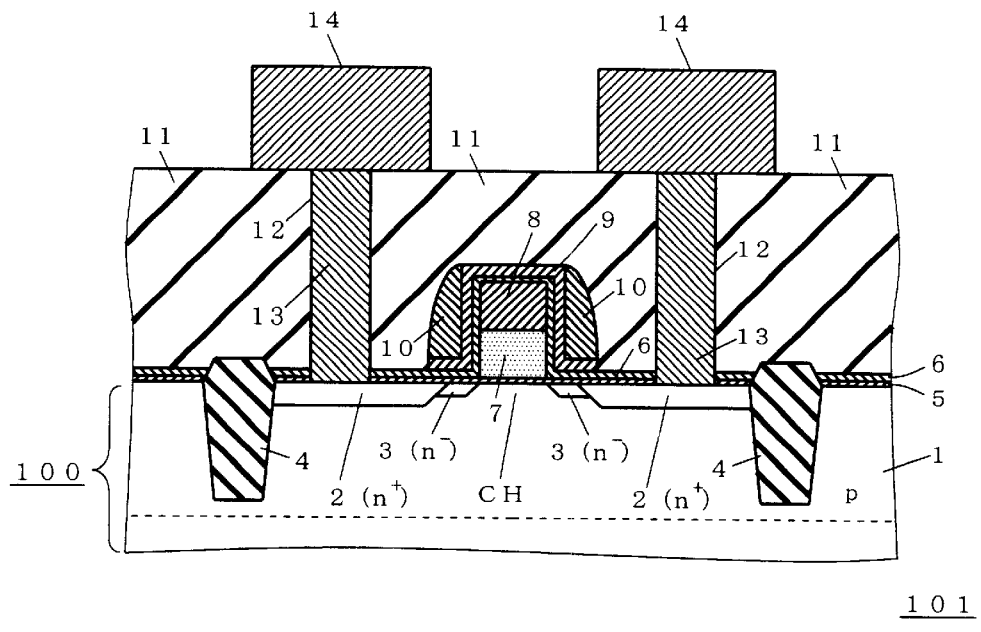
FIG. 1 is a front cross section of a device in accordance with a first preferred embodiment.

FIG. 1 is a front cross section showing a structure of a semiconductor device 101 of the first preferred embodiment. The device 101 comprises a MOSFET in a major surface of a semiconductor substrate 100, and the MOSFET has an LDD structure. The following discussion will be made, taking a case where the semiconductor substrate 100 includes silicon as a main component, which is the most typical material; i.e., it is a silicon substrate. However, needless to say, the present invention is not limited to this example.

The semiconductor substrate 100 comprises a well 1, as a p-type semiconductor layer, exposed in its major surface. Device isolation layers 4 are selectively formed in the major surface of the semiconductor substrate 100. The device isolation layer 4 is preferably made of an insulator which is a silicon oxide and electrically isolates a plurality of device regions in the semiconductor substrate 100 from one another.

The semiconductor substrate 100 further comprises a pair of high-concentration semiconductor layers 2 and a pair of low-concentration semiconductor layers 3 which are selectively so formed as to be shallower than the well 1 and to be exposed in the major surface in an device region between the two device isolation layers 4. The high-concentration semiconductor layer 2 serves as an n$^+$-type semiconductor layer containing a high-concentration n-type impurity and the low-concentration semiconductor layer 3 serves as an n-type semiconductor layer containing a low-concentration n-type impurity.

The paired high-concentration semiconductor layers 2 are isolated from each other. The paired low-concentration semiconductor layers 3 are also isolated from each other, and respective ones thereof are formed as if extending off respective ones of the paired high-concentration semiconductor layers 2 towards a portion of the major surface between the paired high-concentration semiconductor layers 2, being shallower than the paired high-concentration semiconductor layers 2. An exposed surface layer of the well 1 between the paired high-concentration semiconductor layers 2 corresponds to a channel region CH of the MOSFET. The high-concentration semiconductor layers 2 and the low-concentration semiconductor layers 3 correspond to source/drain regions of the MOSFET.

An insulating film 5 is formed on the major surface of the semiconductor substrate 100. The insulating film 5 is preferably a silicon oxide film or a film including silicon oxide as a main component. A gate electrode 7 is so formed on the insulating film 5 as to face the channel region CH. The gate electrode 7 is preferably made of impurity-doped polysilicon or polycide. When the gate electrode 7 is made of polycide containing tungsten silicide, for example, the thickness of tungsten silicide is about 0.1 μm and that of polysilicon is about 0.1 μm. An insulating layer 8 is formed on the gate electrode 7.

An insulating film 6 is so formed as to cover surfaces of the insulating film 5, the gate electrode 7 and the insulating layer 8. Further, an insulating film 9 is so formed as to cover the insulating film 6. The sides of the gate electrode 7 and the insulating layer 8 are covered with sidewalls 10 with the insulating film 6 and the insulating film 9 interposed therebetween. The insulating film 9 is formed so that a portion thereof along the major surface of the semiconductor substrate 100 should not extend off the sidewalls. The insulating film 9 is made of a material whose main component is different from that of the sidewall 10 and the insulating film 6 is made of a material whose main component is different from that of the insulating film 9.

An insulating layer 11 is so formed as to cover the above-described structure formed above the semiconductor substrate 100. In the insulating layer 11, the insulating film 6 and the insulating film 5, a pair of contact holes 12 are selectively formed as through holes immediately above the pair of high-concentration semiconductor layers 2. Each of the contact holes 12 is filled with a conductive main electrode 13, and a pair of main electrodes 13 are thereby connected to the pair of high-concentration semiconductor layers 2, respectively. An interconnection layer 14 is placed on the insulating layer 11 to be connected to the main electrode 13.

Examples of preferable materials and thickness of the elements will be shown below. For example, the insulating film 5 is a silicon oxide film having a thickness of about 3 to 10 nm, the insulating film 6 is a silicon oxide film or a film including silicon oxide as a main component, which has a thickness of about 5 to 10 nm, the insulating film 9 is a silicon nitride film or a film including silicon nitride as a main component, which has a thickness of about 5 to 10 nm, and the sidewall 10 is made of silicon oxide or a material whose main component is silicon oxide, having a thickness of about 10 to 30 nm.

The insulating layer 8 is made of silicon oxide or silicon nitride, or a material whose main component is silicon oxide or silicon nitride, having a thickness of about 0.1 μm. The insulating layer 11 is made of silicon oxide or a material whose main component is silicon oxide. The main electrode 13 is made of, e.g., metal whose base material is tungsten.

The device 101 comprises the MOSFET having the above-described structure. Therefore, in response to a voltage applied to the gate electrode 7, an n-type inversion layer emerges or vanishes in the channel region CH, to thereby control a main current (drain current) flowing from one to the other of the paired main electrodes 13. Further, since the source/drain region comprises the high-concentration semiconductor layer 2 and the low-concentration semiconductor layer 3, forming an LDD structure, it is possible to suppress deterioration of the insulating film 5 due to the hot-carrier effect and suppress a leak current.

<1-2. Method of Manufacturing Device>

Figure 2:
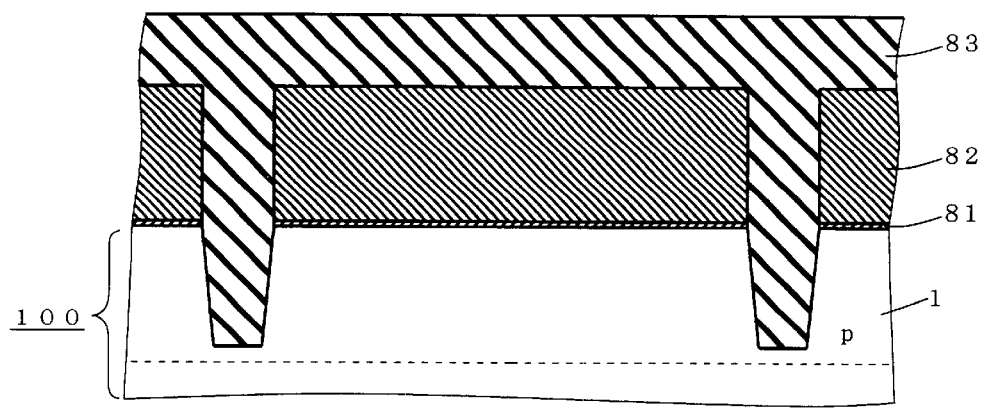
FIGS. 2 to 7 are illustrations showing a manufacturing process for the device in accordance with the first preferred embodiment.

FIGS. 2 to 7 are illustrations showing a method of manufacturing the device 101. To manufacture the device 101, a step of FIG. 2 is first executed. In the step of FIG. 2, the semiconductor substrate 100 including silicon as a main component is prepared. The well 1 is formed in the major surface of the semiconductor substrate 100. Subsequently, an insulating film 81 which is a silicon oxide film is formed on the major surface of the semiconductor substrate 100, and a deposited layer 82 which is a silicon nitride layer is formed thereon.

A trench is selectively formed at a portion corresponding to the device isolation layer 4 in the semiconductor substrate 100, the insulating film 81 and the deposit layer 82. After that, a material of the device isolation layer 4, e.g., silicon oxide is so deposited as to fill the trench and cover a surface of the deposit layer 82, thereby forming an insulating layer 83. The above-discussed step of FIG. 2 is a conventionally well known and no further detailed discussion will be made.

Figure 3:
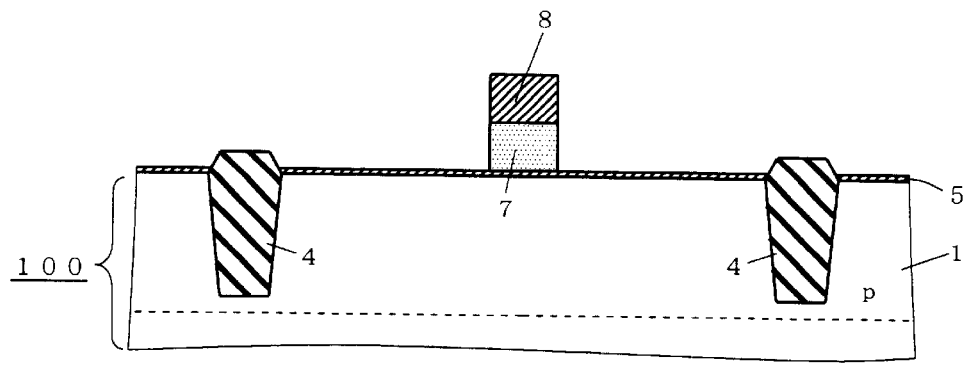

Next, a step of FIG. 3 is executed. In the step of FIG. 3, the structure on the major surface of the semiconductor substrate 100, i.e., the insulating film 81, the deposit layer 82 and the insulating layer 83 are removed by CMP (Chemical Mechanical Polishing). The major surface of the semiconductor substrate 100 is thereby exposed and the device isolation layer 4 is formed. Though a head of the device isolation layer 4 usually protrudes from the major surface of the semiconductor substrate 100 to some degree as the result of polishing as shown in FIG. 3, the polishing may be so performed as to make the head level with the major surface.

The insulating film 5 is formed on the major surface of the semiconductor substrate 100 by, e.g., thermal oxidation, and after that the gate electrode 7 and the insulating layer 8 are formed on the insulating film 5. To form the gate electrode 7 and the insulating layer 8, a material of the gate electrode 7 is deposited on the insulating film 5 and a material of the insulating layer 8 is deposited thereon, and then selective etching is performed.

Figure 4:
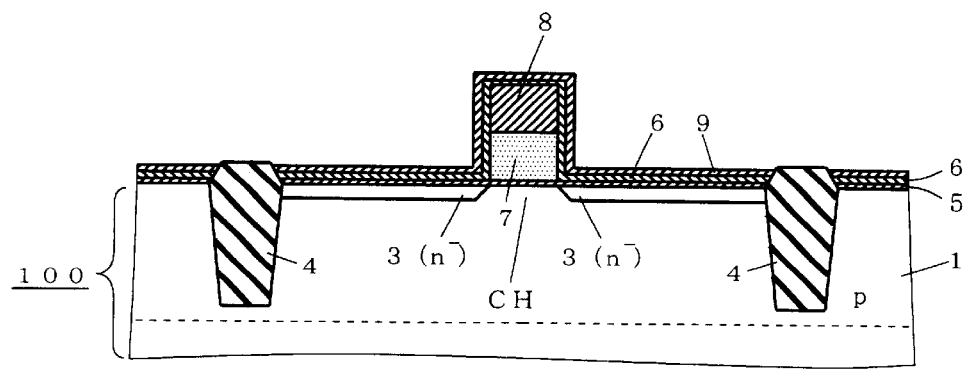

Next, a step of FIG. 4 is executed. In the step of FIG. 4, an n-type impurity is selectively implanted into a portion of the major surface of the semiconductor substrate 100 between a pair of device isolation layers 4 with the gate electrode 7 and the insulating layer 8 as a mask and then diffused, to form the low-concentration semiconductor layers 3. As a result, a pair of low-concentration semiconductor layers 3 are so formed as to be exposed on a region between the paired device isolation layers 4 in the major surface of the semiconductor substrate 100 and to be opposed to each other with a portion immediately below the gate electrode 7 interposed therebetween. Though FIG. 4 shows a normal implantation of the impurity into the major surface of the semiconductor substrate 100 as an example, an oblique implantation may be performed.

After that, the insulating film 6 and the insulating film 9 are so formed in this order as to entirely cover an exposed surface above the semiconductor substrate 100. The insulating film 6 and the insulating film 9 are formed by LPCVD (Low-Pressure CVD) to have a thickness of, e.g., about 10 nm. The implantation of impurity for forming the low-concentration semiconductor layers 3 may be performed after forming the insulating film 6 and the insulating film 9. In this case, it is desirable that the impurity should be implanted obliquely.

Figure 5:
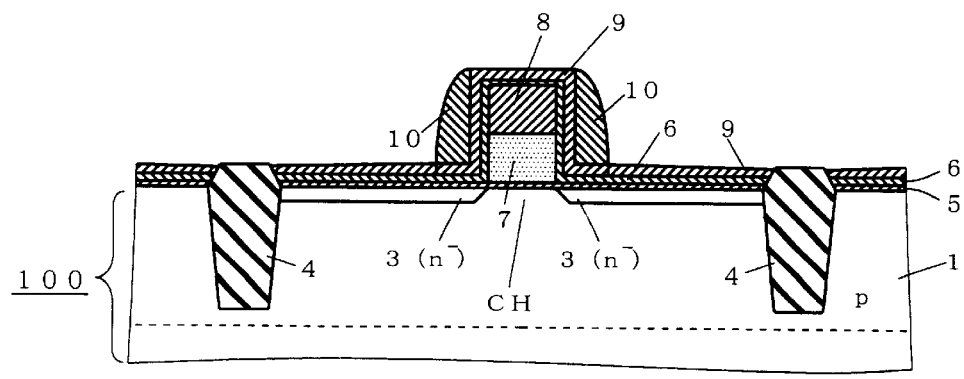

Next, a step of FIG. 5 is executed. In the step of FIG. 5, a material of the sidewall 10 is so deposited by LPCVD as to entirely cover a surface of the insulating film 9. The material has a main component different from that of the insulating film 9. Anisotropic etching is thereafter performed using RIE to selectively remove the deposited material. As a result, the sidewalls 10 are formed by such a self-alignment process.

The insulating film 9 and the sidewall 10 are different from each other in their main components; therefore, it is possible to etch the sidewall 10 selectively out of the insulating film 9 and the sidewall 10 by using an etching process with different etching rates between the two. In a process for forming the sidewall 10, an etching that is effective not for the insulating film 9 but for the sidewall 10 is utilized, and therefore the insulating film 9 serves as a protective film for the major surface of the semiconductor substrate 100. In other words, it is possible to avoid a disadvantage that the major surface of the semiconductor substrate 100 is etched in the process for forming the sidewall 10. Further, the insulating film 5 is usually left, not being etched. Therefore, when the sidewall 10 is completed, usually, an insulating film is left thicker than the insulating film 5 on the major surface of the semiconductor substrate 100.

Figure 6:
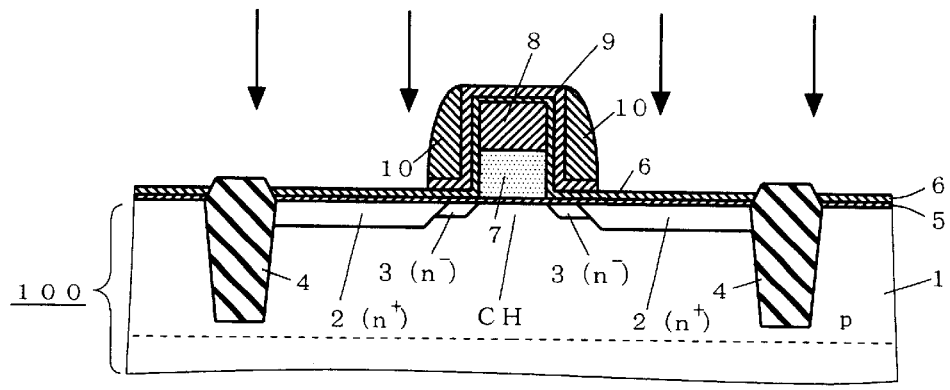

Next, a step of FIG. 6 is executed. In the step of FIG. 6, only the portion of the insulating film 9 extending off the sidewalls 10 along the major surface of the semiconductor substrate 100 is removed. This step is achieved by etching that is effective not for the insulating film 6 but for the insulating film 9, such as wet etching using phosphoric acid and the like as an etchant. Therefore, the insulating film 6 serves as a protective film for the major surface of the semiconductor substrate 100 when the insulating film 9 is removed. Though not shown, the thickness of the insulating film 6 usually decreases in this process.

After that, an n-type impurity is selectively implanted into a portion of the major surface of the semiconductor substrate 100 between the pair of device isolation layers 4 with the gate electrode 7, the insulating layer 8, the insulating film 9 and the sidewalls 10 as a mask and then diffused, to form the high-concentration semiconductor layers 2. As a result, a pair of high-concentration semiconductor layers 2 are provided, being exposed in the major surface of the semiconductor substrate 100, so that opposed edges thereof are recessed from opposed edges of the paired low-concentration semiconductor layers 3 when viewed from the channel region CH.

The impurity implanted to form the high-concentration semiconductor layers 2 is determined higher both in concentration and energy than that implanted to form the low-concentration semiconductor layers 3. Therefore, the high-concentration semiconductor layers 2 are formed to be higher in concentration and deeper than the low-concentration semiconductor layers 3.

Figure 7:
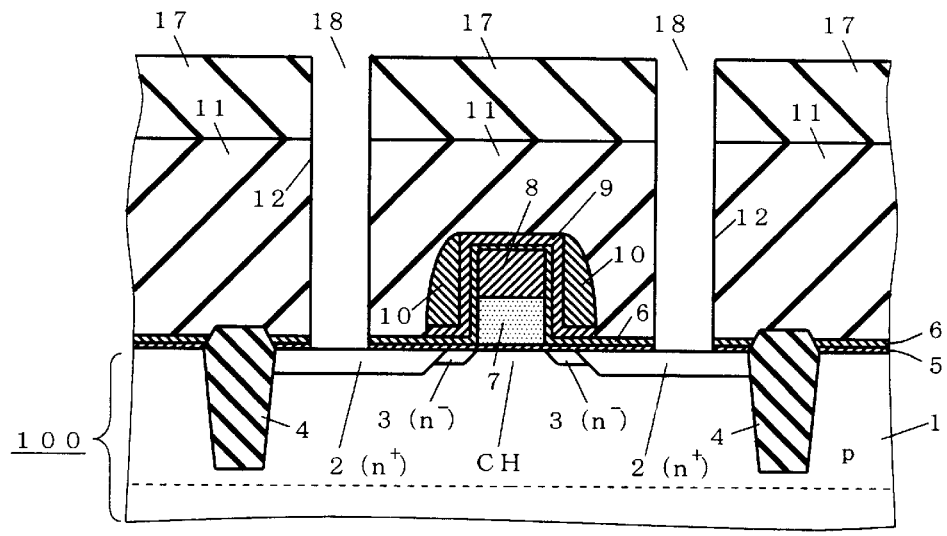

Next, a step of FIG. 7 is executed. In the step of FIG. 7, a material of the insulating layer 11 is so deposited by LPCVD as to entirely cover an exposed surface above the semiconductor substrate 100. After that, a resist layer 17 is formed on the deposited material. Openings 18 are selectively formed in the resist layer 17. The openings 18 are formed immediately above the paired high-concentration semiconductor layers 2.

Subsequently, the insulating film 5, the insulating film 6 and the insulating layer 11 are selectively etched with the resist layer 17 as a mask, to form contact holes 12. Though not shown, through this step, another contact hole similar to the contact hole 12 is formed also immediately above the gate electrode 7. In a process for forming the contact holes 12, there is no need for etching the insulating film 9 since the portion of the insulating film 9 along the major surface of the semiconductor substrate 100 has been already removed. Therefore, in this etching step, an etching that is less effective for the insulating film 9 can be used. When the insulating film 5, the insulating film 6 and the insulating layer 11 have the same main component, especially, the etching is readily performed.

Referring back to FIG. 1, through the CVD, the contact holes 12 (and the contact hole on the gate electrode 7, which is not shown) are filled with a conductive material with good coverage such as tungsten, to form the main electrodes 13. After that, the interconnection layers 14 are placed on the insulating layer 11 to be connected to the main electrodes 13. Through the above steps, the device 101 is completed.

As discussed above, in the device 101, the insulating film 9 serves to avoid the disadvantage that the major surface of the semiconductor substrate 100 is etched in the step of forming the sidewalls 10. As a result, the electric field concentration in the pn junction, which is a problem in the background art, is relieved and the intrinsic advantage of the LDD structure can be effectively taken. This contributes to size reduction of the device 101.

Since only the portion of the insulating film 9 along the major surface of the semiconductor substrate 100 is removed, the etching that is less effective for the insulating film 9 can be used in the step of forming the contact holes in the insulating layer 11. As a result, there is no possibility that the contact holes 12 and the gate electrode 7 are electrically short-circuited even if the contact holes 12 overlap the gate electrode 7 due to misalignment of the mask or narrower spacing between the contact holes 12 than the width of the gate electrode 7 along the channel length (from one of the paired low-concentration semiconductor layers 3 to the other). This also contributes to size reduction of the device 101.

Since the insulating film 6 is provided below the insulating film 9 in the device 101, it is possible to prevent careless etching of the major surface of the semiconductor substrate 100 when only the insulating film 9 is removed by etching. In other words, it is advantageous that there arises no possibility of losing the effect of the insulating film 9 even though the portion of the insulating film 9 along the major surface of the semiconductor substrate 100 is so formed as not to extend off the sidewalls 10.

<2. The Second Preferred Embodiment>

Figure 8:
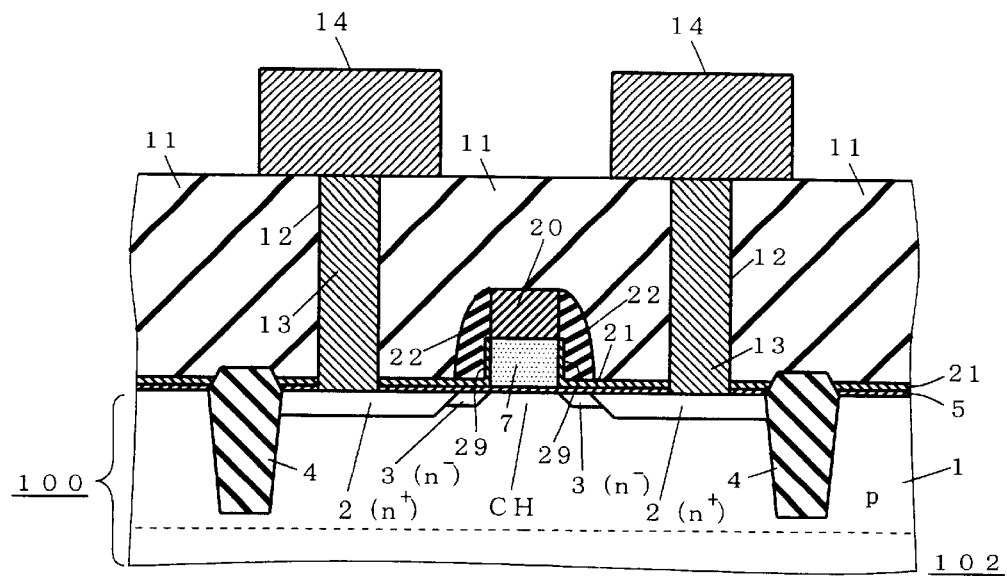
FIG. 8 is a front cross section of a device in accordance with a second preferred embodiment.

FIG. 8 is a front cross section showing a structure of a semiconductor device 102 of the second preferred embodiment. The device 102 comprises a MOSFET having an LDD structure like the device 101, but has a characteristic difference from the device 101 in having an insulating film 29 and an insulating film 21 instead of the insulating film 6 and the insulating film 9.

The insulating film 21 is interposed between the side surface of the gate electrode 7 and a sidewall 22. The insulating film 21 is so formed as to cover the portion of the insulating film 5 which extends off the gate electrode 7. The insulating film 21 is made of a material whose main component is different from that of the sidewall 22. These materials are chosen so that the sidewall 22 has precedence over the insulating film 21 in etching. The insulating film 29 is so formed as to cover the side surface of the gate electrode 7.

For example, the insulating film 21 is a silicon oxide film obtained by thermal oxidation and the sidewall 22 is made of silicon nitride or a material whose main component is silicon nitride. The insulating film 29 is made of a material whose main component is the same as that of the insulating film 21. An insulating layer 20 is made of, e.g., silicon nitride or a material whose main component is silicon nitride. Alternatively, there may be a composition where an upper layer of the insulating layer 20 is made of silicon nitride and a lower layer is made of silicon oxide. The insulating layer 20 has a thickness of e.g., about 0.1 μm.

Figure 9:
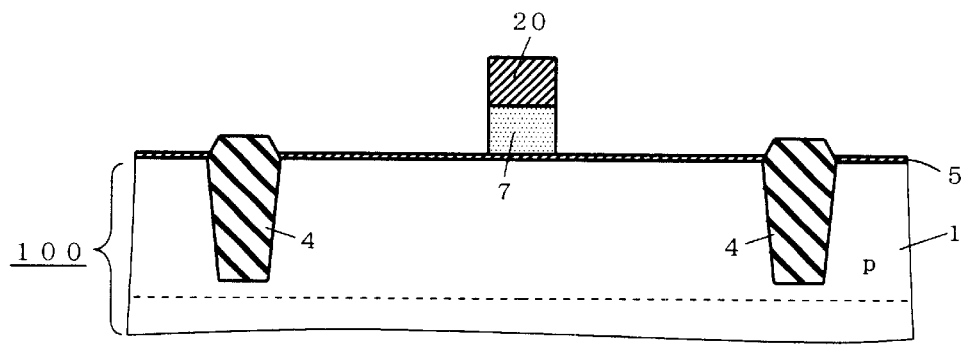
FIGS. 9 to 13 are illustrations showing a manufacturing process for the device in accordance with the second preferred embodiment.

FIGS. 9 to 13 are illustrations showing a method of manufacturing the device 102. To avoid redundancy in the following discussion, detailed description for the same steps as in the first preferred embodiment will be omitted. To manufacture the device 102, after the step of FIG. 2, a step of FIG. 9 is executed. In the step of FIG. 9, the insulating film 5 is formed on the major surface of the semiconductor substrate 100 after CMP like the step of FIG. 3, and the gate electrode 7 and the insulating layer 20 are thereafter formed on the insulating film 5.

Figure 10:
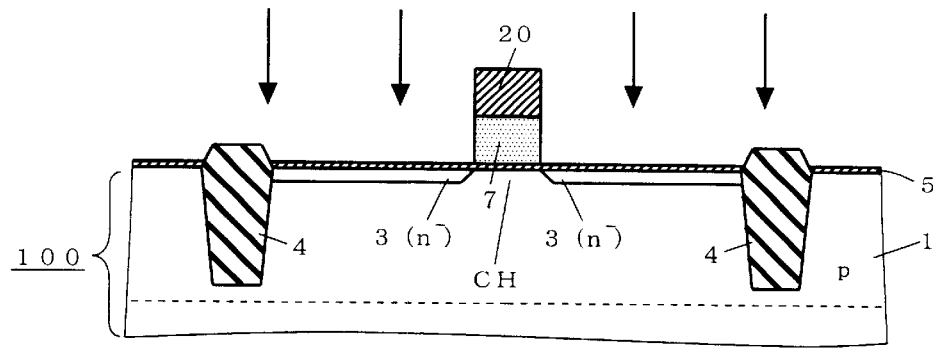
Figure 11:
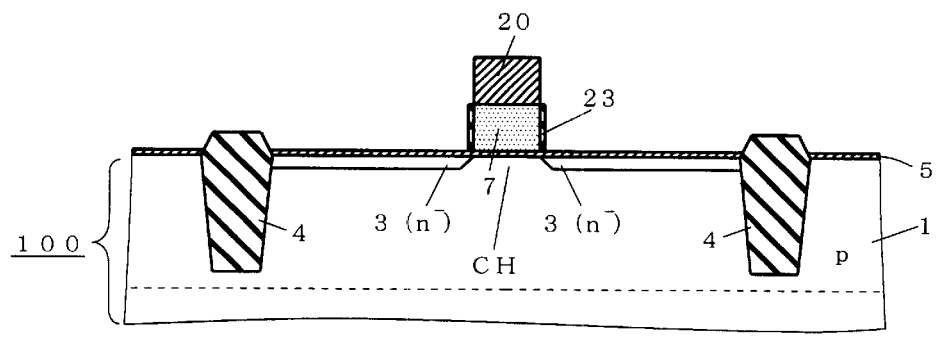

Next, as shown in FIG. 10, an n-type impurity is selectively implanted into the major surface of the semiconductor substrate 100 with the gate electrode 7 and the insulating layer 8 as a mask and then diffused, to form the low-concentration semiconductor layers 3. As shown in FIG. 11, an insulating film 23 is formed on the side surface of the gate electrode 7 by using, e.g., lamp annealing. The temperature for this treatment is determined in a range from 800° C. to 1200° C. The insulating film 23 may be formed before the impurity implantation in the step of FIG. 10.

Figure 12:
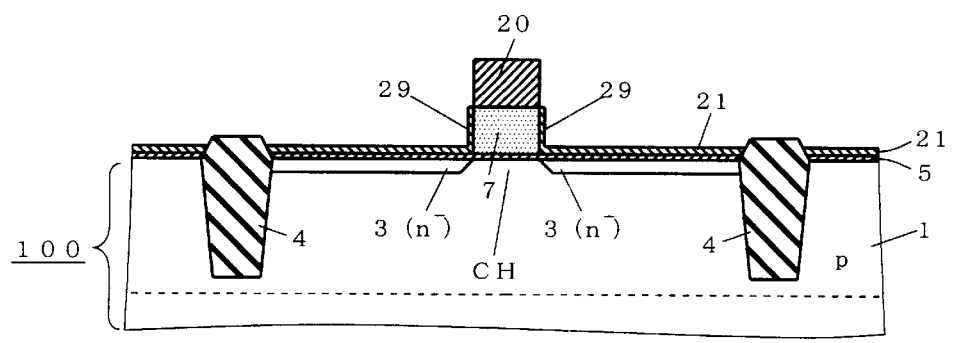

Next, as shown in FIG. 12, the insulating film 21, which is a silicon oxide film, is formed by thermal oxidation. In this process, the insulating film 23 is converted into a material whose main component is substantially the same as that of the insulating film 21, to become the insulating film 29. In the process of forming the insulating film 21, however, the insulating film 23 serves as a protective film of the side surface of the gate electrode 7 while converting into the insulating film 29. After the step of FIG. 12, since the insulating film 21 exists, an insulating film on the semiconductor substrate 100 becomes thicker than the insulating film 5 and further usually becomes thicker than the insulating film 23.

Figure 13:
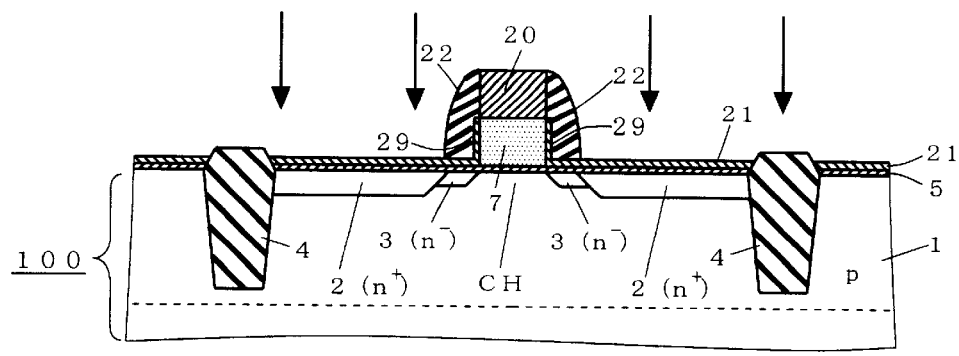

Next, a step of FIG. 13 is executed. In the step of FIG. 13, a material of the sidewall 22 is so deposited as to entirely cover an exposed surface above the semiconductor substrate 100. After that, the deposited material of the sidewall 22 is selectively removed by using appropriate RIE, to form the sidewall 22.

Since the insulating film 21 having strong resistance to this etching is formed, the insulating film 21 together with the insulating film 5 serves as a protective film for the major surface of the semiconductor substrate 100 in the process of forming the sidewall 22. Since the major surface of the semiconductor substrate 100 is covered with both the insulating films 5 and 21 thicker than with the insulating film 5 alone, the major surface can be effectively protected from the etching.

Subsequently, an n-type impurity is selectively implanted into a portion of the major surface of the semiconductor substrate 100 between a pair of device isolation layers 4 with the gate electrode 7, the insulating layer 20 and the sidewalls 22 as a mask and then diffused, to form the high-concentration semiconductor layers 2. Next, through the step of FIG. 7 and the step discussed with reference to FIG. 1 in the first preferred embodiment, the insulating layer 11, the main electrodes 13 and the interconnection layer 14 are formed as shown in FIG. 8. Thus, the device 102 is completed.

Figure 14:
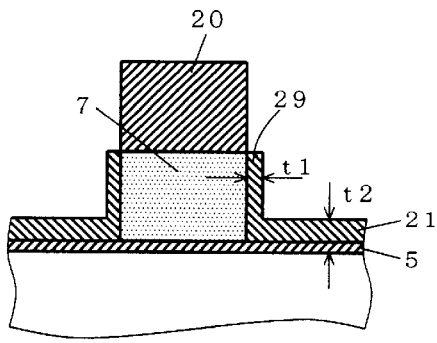
FIG. 14 is a partial magnified view of the device in accordance with the second preferred embodiment.

Further, an insulating film can be formed thinner on the major surface than the insulating film 29, instead of being formed thicker. There may be three relations between two film thicknesses t1 and t2 shown in FIG. 14, i.e., t1>t2, t1=t2 and t1<t2. These relations depend on the material of the gate electrode 7 and the impurity concentration of the semiconductor substrate 100.

As discussed above, in the device 102, the insulating film 21 serves as a protective film for the major surface of the semiconductor substrate 100 in the process of forming the sidewall 22 by selective etching, to avoid the disadvantageous etching of the major surface of the semiconductor substrate 100. Thus, the electric field concentration in the pn junction is relieved and the intrinsic advantage of the LDD structure can be effectively taken. This contributes to size reduction of the device 102.

Further, since the insulating film 29 covers the side surface of the gate electrode 7, the insulating film 29 serves as a protective film for the gate electrode 7 in the process of forming the insulating film 21, to prevent the gate electrode from thinning. This also contributes to size reduction of the device 102.

When the sidewall 22 and the insulating layer 20 are made of a material having strong resistance to the etching for the insulating layer 11 such as silicon nitride, it is possible to avoid electrical short circuit between the contact holes 12 and the gate electrode 7 even if the contact holes 12 overlap the gate electrode 7 due to misalignment of the mask or narrower spacing between the contact holes 12 than the width of the gate electrode 7. This also contributes to size reduction of the device 102.

When the insulating film 5, the insulating film 21 and the insulating layer 11 have the same main component, in particular, it is advantageous that the contact holes 12 can be easily formed.

<3. The Third Preferred Embodiment >

Figure 15:
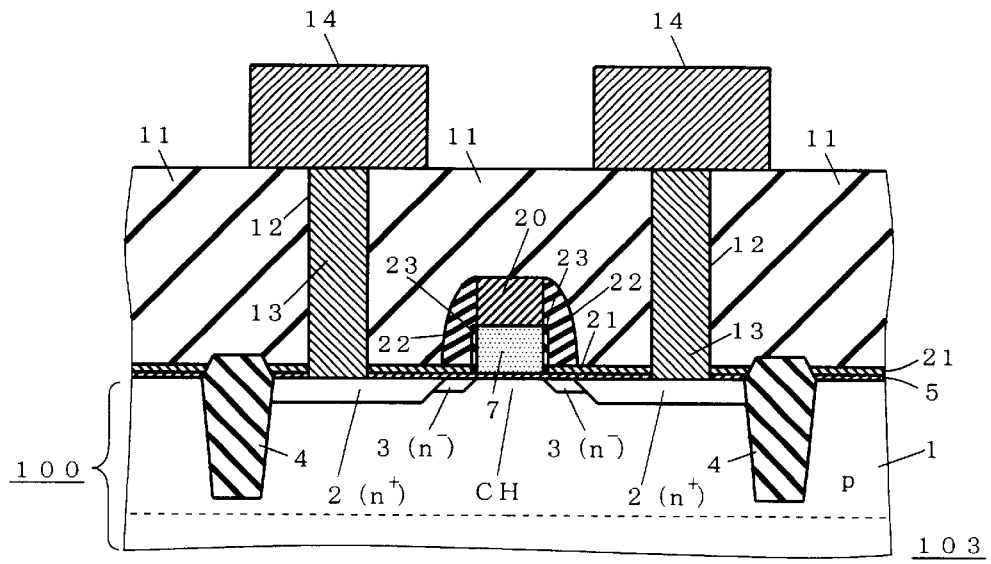
FIG. 15 is a front cross section of a device in accordance with a third preferred embodiment.

FIG. 15 is a front cross section showing a structure of a semiconductor device 103 of the third preferred embodiment. The device 103 has a characteristic difference from the device 102 in that the insulating film 23 is left on at least a portion of the insulating film 29. Specifically, the insulating film 23 is left in at least a portion with which the side surface of the gate electrode 7 is in contact, instead of converting all the insulating film 23 into the material whose main component is the same as that of the insulating film 21 in the process of forming the insulating film 21. This can more effectively suppress thinning of the gate electrode 7 in the process of forming the insulating film 21. FIG. 15 shows an exemplary case where all the insulating film 29 remains being the insulating film 23.

Figure 16:
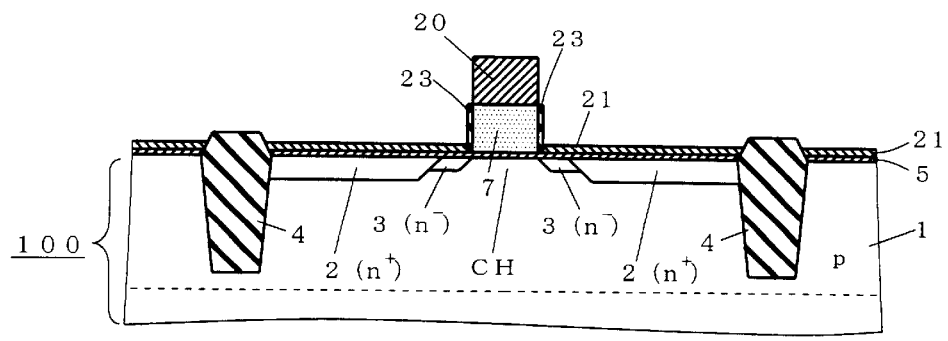
FIGS. 16 to 18 are illustrations showing a manufacturing process for the device in accordance with the third preferred embodiment.
Figure 17:
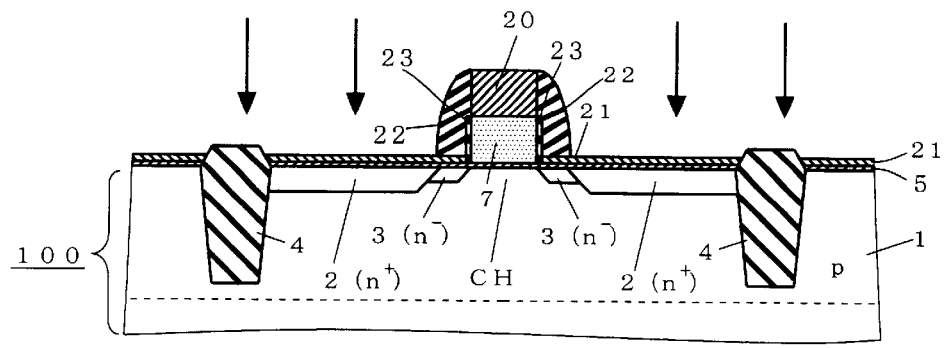
Figure 18:
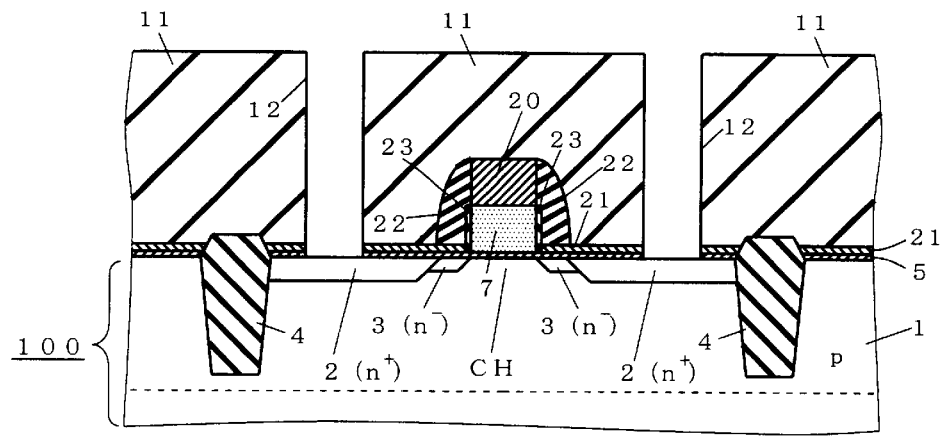

FIGS. 16 to 18 are illustrations showing a method of manufacturing the device 103. To manufacture the device 103, the steps of FIGS. 9 to 11 in the second preferred embodiment are first executed. After that, as shown in FIG. 16, the insulating film 21 which is a silicon oxide film is formed by thermal oxidation.

At this time, a condition for formation of the insulating film 21 is determined so that only a surface portion of the insulating film 23 is converted into the silicon oxide film or the whole insulating film 23 remains being a silicon nitride film. This can more effectively suppress corrosion of the gate electrode 7 in formation of the insulating film 21. Also in this case, an insulating film on the major surface of the semiconductor substrate 100, i.e., the insulating film 5 and the insulating film 21, usually becomes thicker than the insulating film 23.

Next, a step of FIG. 17 is executed. In the step of FIG. 17, a material of the sidewall 22 is so deposited as to entirely cover an exposed surface above the semiconductor substrate 100. After that, the deposited material is selectively removed by using RIE, to form the sidewall 22.

Since the insulating film 21 having strong resistance to this etching is formed, the insulating film 21 together with the insulating film 5 serves as a protective film for the major surface of the semiconductor substrate 100 in the process of forming the sidewall 22. Since the major surface of the semiconductor substrate 100 is covered with both the insulating films 5 and 21 thicker than with the insulating film 5 alone, the major surface can be effectively protected from the etching. Subsequently, an n-type impurity is selectively implanted into the major surface of the semiconductor substrate 100 with the gate electrode 7, the insulating layer 20 and the sidewalls 22 as a mask and then diffused, to form the high-concentration semiconductor layers 2.

Next, a step of FIG. 18 is executed. In the step of FIG. 18, the insulating layer 11 is formed through the same step as shown in FIG. 7. Further, the contact holes 12 are formed in the insulating film 5, the insulating film 21 and the insulating layer 11 through the same step as shown in FIG. 7.

The insulating layer 11, the main electrodes 13 and the interconnection layer 14 are formed as shown in FIG. 15 through the same step as discussed referring to FIG. 1 in the first preferred embodiment. Thus, the device 103 is completed.

Figure 19:
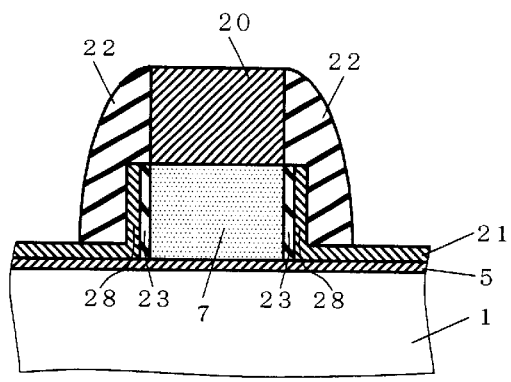
FIG. 19 is a partial magnified view of another example of the device in accordance with the third preferred embodiment.

Though FIGS. 15 to 18 show the case where the insulating film 23 remains being a silicon nitride film, there may be a case where only a portion of the insulating film 23 remains being a silicon nitride film. FIG. 19 is an partially enlarged view showing the latter case. In this case, the insulating film 23 remains only in a region adjacent to the gate electrode 7, which is covered with the insulating film 28 converted into a material whose main component is the same as that of the insulating film 21. This case can also sufficiently suppress corrosion of the gate electrode 7 in formation of the insulating film 21.

<4. The Fourth Preferred Embodiment>

Figure 20:
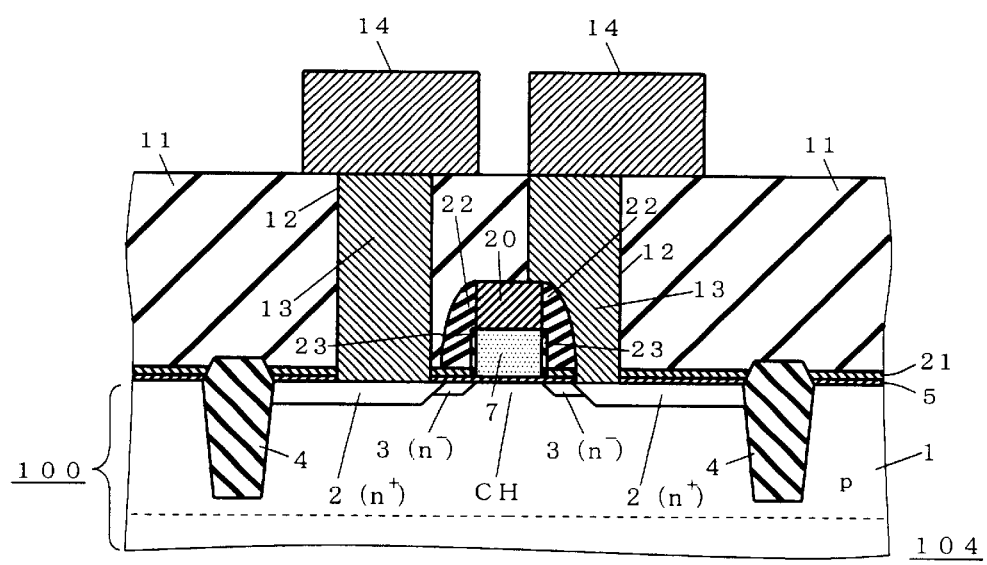
FIG. 20 is a front cross section of a device in accordance with a fourth preferred embodiment.

FIG. 20 is a front cross section showing a structure of a semiconductor device 104 of the fourth preferred embodiment. The device 104 has a characteristic difference from the device 103 in that the spacing between a pair of contact holes 12 filled with the main electrodes 13 is determined narrower than the width of the gate electrode 7. It should be noted that FIG. 20 is not to scale as to the illustrated width of the gate electrode 7 and the illustrated width of the spacing between contact holes 12 and that this figure further shows of only one possible result of such contact hole spacing in terms of one of the contact holes and main electrodes therein result, in the device 104, the contact holes 12 are formed, the gate electrode 7.

To make this structure possible, in the device 104, the sidewall 22 is made of a material having strong resistance to the etching for the insulating layer 11 such as silicon nitride or a material whose main component is silicon nitride. Though FIG. 20 shows a case where all the insulating film 23 remains on the side surface of the gate electrode 7, there may be a case where all the insulating film 23 is converted into the insulating film 29 as shown in FIG. 8 or where only a portion of the insulating film 23 remains unconverted as shown in FIG. 19.

The device 104 of FIG. 20 is not to scale, as noted above, and illustrates one possibility as to the gate electrode 7 being overlapped by a single contact hole 12 when the spacing between the contact holes 12 is determined narrower than the width of the gate electrode 7, which spacing facilitates size reduction. Moreover, there is no possibility of electrical short circuit between any one of the main electrodes 13 and the gate electrode 7 since the materials of the sidewall 22 and the insulating layer 20 are chosen as above.

Even in the case that the spacing between a pair of contact holes 12 is not narrower than the width of the gate electrode 7 (that is, even in the case of the scale illustrated in FIG. 20), a pair of contact holes 12 can be formed at a position that overlaps the gate electrode 7. This produces an advantage that a short circuit between the main electrodes 13 and the gate electrode 7 can be prevented even without high positional accuracy of the mask pattern.

Figure 21:
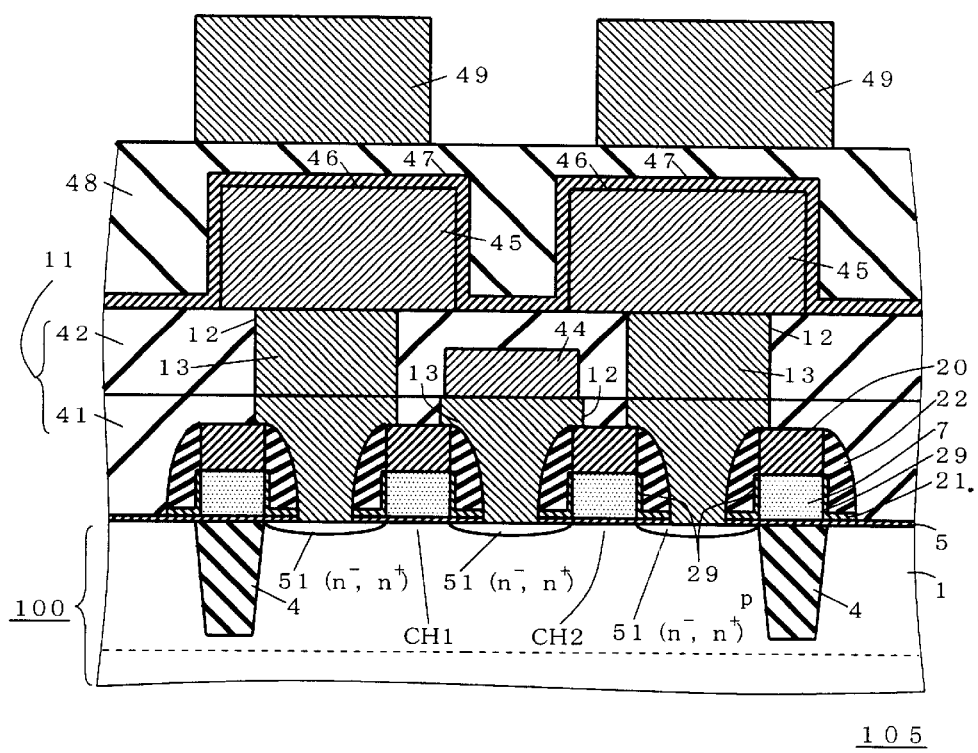
FIG. 21 is a front cross section of a device in accordance with a fifth preferred embodiment.

The device 104 can be manufactured through the same process steps as the device 103 is manufactured, except that the materials of the sidewall 22 and the insulating layer 20 are limited and that the contact holes 12 are formed at different positions. Therefore, no further detailed discussion will be made on a method of manufacturing the device 104, except to note that when the spacing between the contact holes 12 is narrower than the width of gate electrode 7 to facilitate size reduction, it is possible to form this spacing to be narrow enough so that both of the contact holes 12 and main electrodes 13 therein will overlap the gate electrode 7 as illustrated in FIG. 21, discussed below relative to the fifth preferred embodiment.

<5. The Fifth Preferred Embodiment>

The device 104 of the fourth preferred embodiment, which has an excellent effect of facilitating size reduction as discussed above, is especially suitable to be used in a DRAM (dynamic RAM). FIG. 21 is a front cross section of a semiconductor device 105 of the fifth preferred embodiment, showing an exemplary one used in a DRAM. In FIG. 21, for simple illustration, both the high-concentration semiconductor layers 2 and the low-concentration semiconductor layers 3 are represented together as a semiconductor region 51. FIG. 21 shows a case where all the insulating film 23 is converted into the insulating film 29.

The two gate electrodes 7 are formed in a region along the major surface of the semiconductor substrate 100 between a pair of device isolation layers 4, one of which faces a channel region CH1 and the other faces a channel region CH2. Each gate electrode 7 is accompanied with the insulating film 5, the insulating layer 20, the sidewalls 22, the insulating films 21 and the insulating films 29. The insulating layer 11 is so formed as to cover the above structure and the major surface of the semiconductor substrate 100.

The insulating layer 11 comprises an insulting layer 41 serving as a lower layer and an insulating layer 42 serving as an upper layer. In the insulating layer 11, the contact holes 12 filled with the main electrodes 13 are selectively so formed as to penetrate the insulating layer 41 or both the insulating layer 41 and the insulating layer 42. The spacing between the adjacent contact holes 12 is determined narrower than the width of the gate electrode 7.

The main electrode 13 penetrating only the insulating layer 41 is connected to an interconnection layer 44 placed on the insulating layer 41. The interconnection layer 44 serves as a bit-line wire. The main electrode 13 penetrating both the insulating layer 41 and the insulating layer 42 is connected to a storage node 45 placed on the insulating layer 42. A cell plate electrode 47 covers the storage node 45 with a cell plate insulating film 46 interposed therebetween. An insulting layer 48 covers a surface of the cell plate electrode 47. An interconnection layer 49 is placed on the insulating layer 48.

The device 105, which has the above structure, works as a DRAM having a storage capacitor, and the gate electrode 7 serves as a transfer gate. Moreover, since the spacing between the adjacent contact holes 12 is determined narrower than the width of the gate electrode 7 while preventing a short circuit, a DRAM with highly-integrated memory cells can be achieved.

Figure 22:
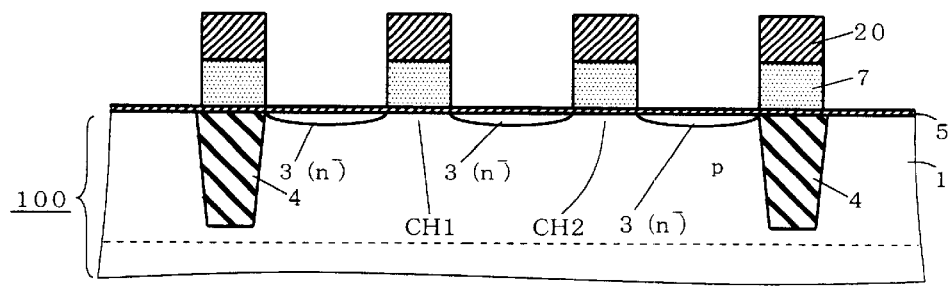
FIGS. 22 to 28 are illustrations showing a manufacturing process for the device in accordance with the fifth preferred embodiment.

FIGS. 22 to 28 are illustrations showing a method of manufacturing the device 105. To manufacture the device 105, the step of FIG. 2 in the first preferred embodiment is first executed. After that, a step of FIG. 22 is executed to form the gate electrode 7, the insulating layer 20 and the low-concentration semiconductor layers 3. The step of FIG. 22 is the same as those of FIGS. 9 and 10 except that the number of gate electrodes 7 and insulating layers 20 formed between a pair of device isolation layers 4 are different.

Figure 23:
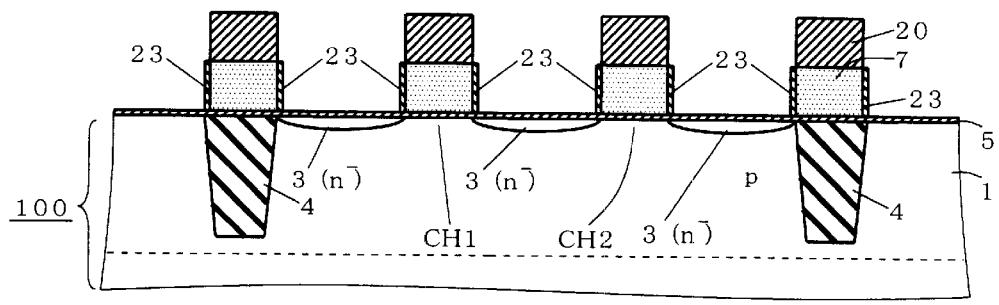
Figure 24:
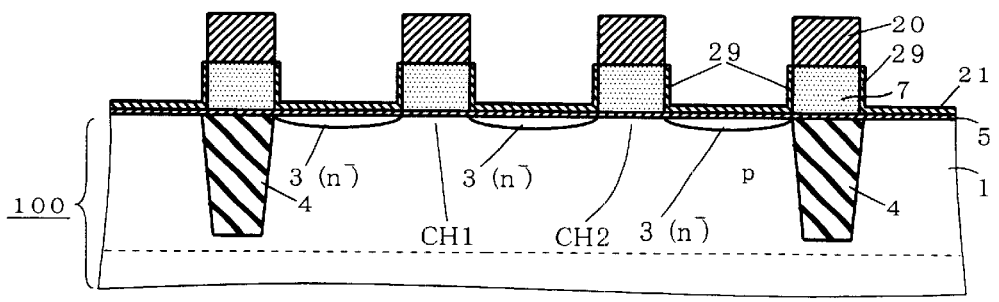
Figure 25:
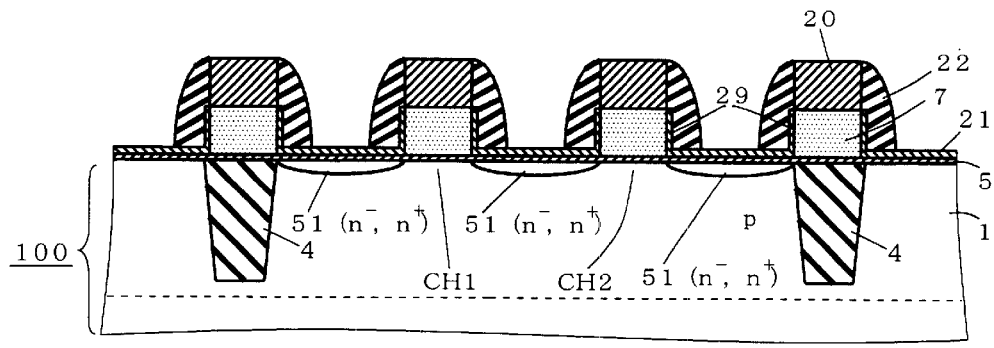

Through a step of FIG. 23, the insulating film 23 is formed. The step is executed in the same manner as that of FIG. 11. Subsequently, the insulating film 21 is formed through a step of FIG. 24. The step is executed in the same manner as that of FIG. 12. The sidewalls 22 and the semiconductor region 51 are thereafter formed through a step of FIG. 25. The step is executed in the same manner as that of FIG. 13.

Figure 26:
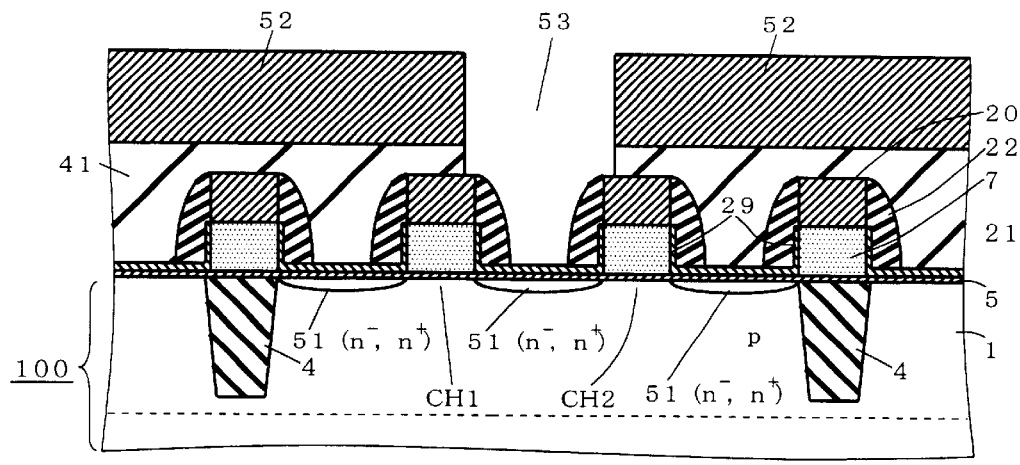

After that, a step of FIG. 26 is executed. In the step of FIG. 26, the insulating layer 41 is so deposited as to entirely cover an exposed surface above the semiconductor substrate 100. Deposition of the insulating layer 41 is made by using, e.g., LPCVD. Like in the fourth preferred embodiment, the insulating layer 41 which is part of the insulating layer 11 is made of a material whose main component is different from that of the sidewall 22 and the insulating layer 20.

A resist layer 52 is deposited on the insulating layer 41 and an opening 53 is selectively formed in the resist layer 52. The opening 53 is formed at a position for providing the contact hole 12 to be connected to the interconnection layer 44 as a bit wire. Subsequently, the insulating layer 41 is selectively removed with the resist layer 52 as a mask, to form the contact hole 12.

Figure 27:
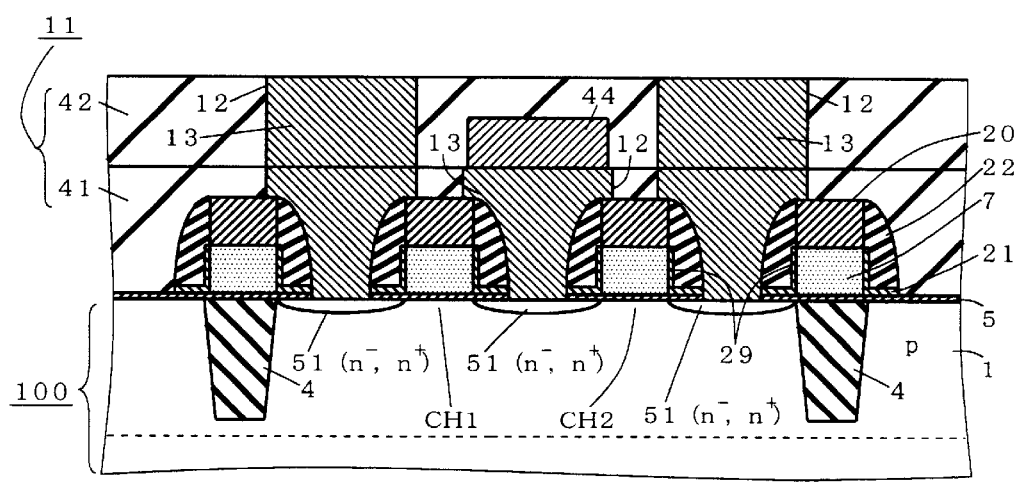

Next, a step of FIG. 27 is executed. In the step of FIG. 27, after filling the main electrode 13 into the contact hole 12 formed in the insulating layer 41, the interconnection layer 44 is formed on the insulating layer 41, to be connected to the main electrode 13. After that, the insulating layer 42 is so deposited as to cover surfaces of the insulating layer 41 and the insulating layer 44 by using, e.g., LPCDV. After forming the contact holes 12 which penetrate both the insulating layer 41 and the insulating layer 42, the main electrodes 13 fill the contact holes 12.

Figure 28:
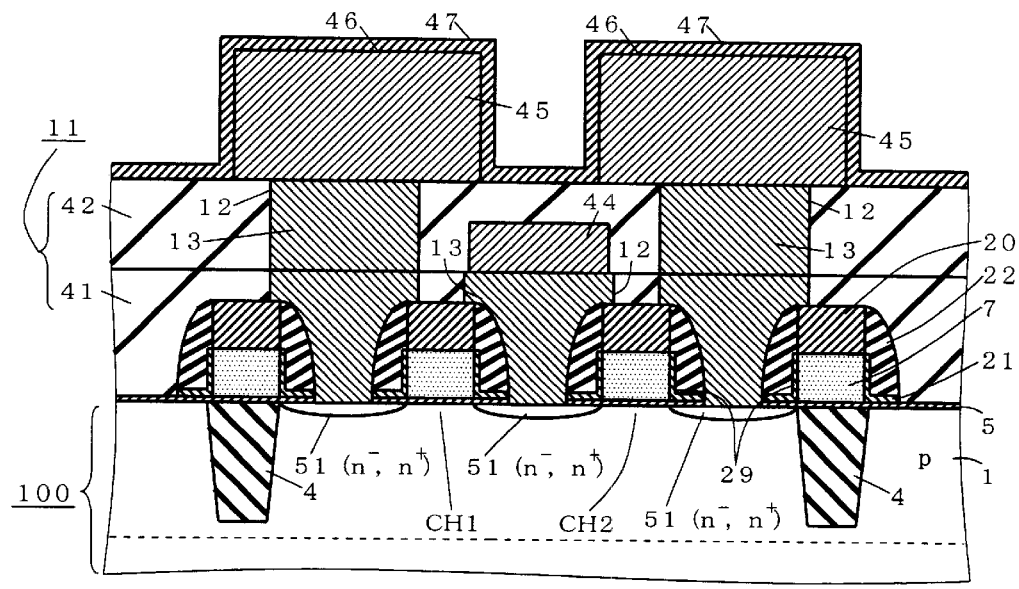
Figure 29:
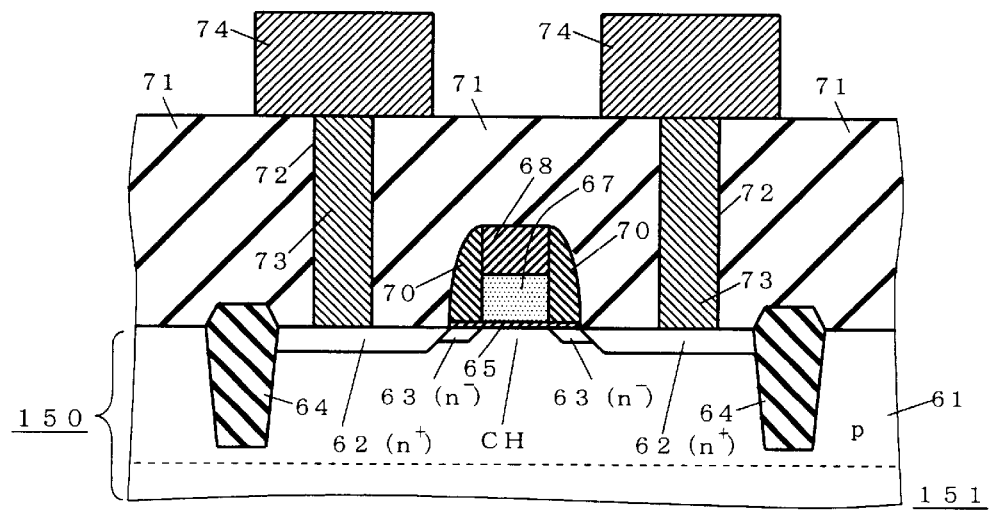
FIG. 29 is a front cross section of a device in the background art.
Figure 30:
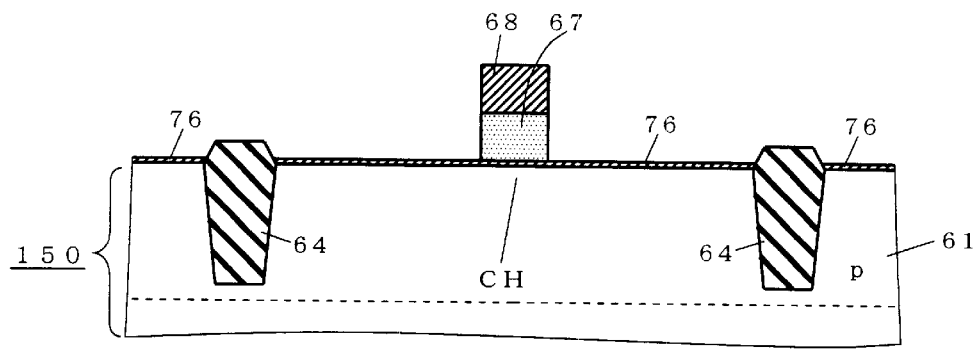
FIGS. 30 to 35 are illustrations showing a manufacturing process for the device in the background art.
Figure 31:
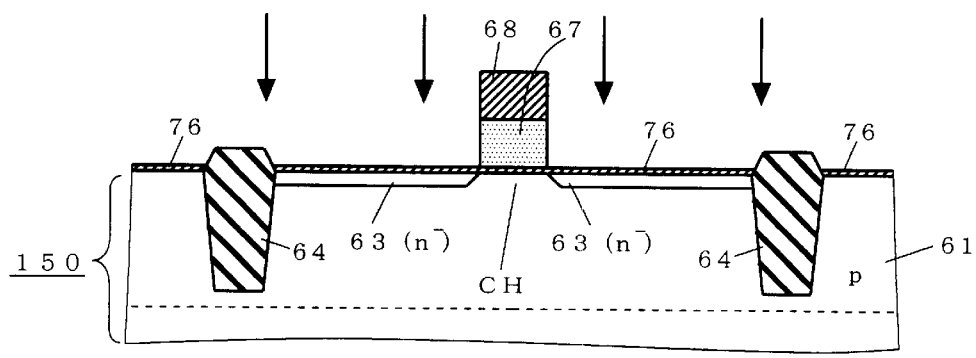
Figure 32:
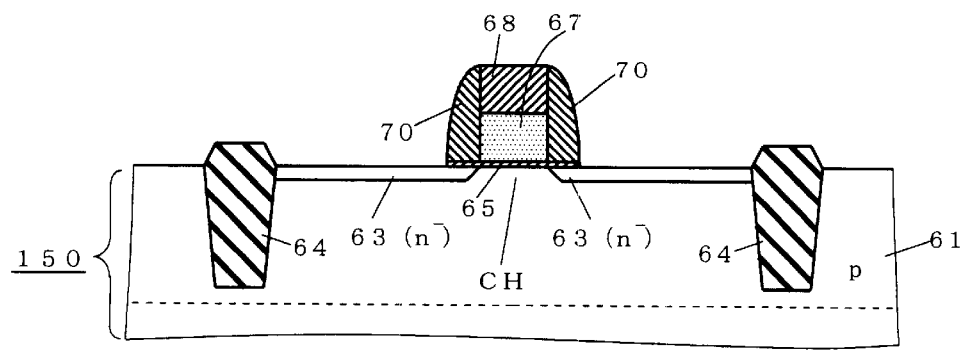
Figure 33:
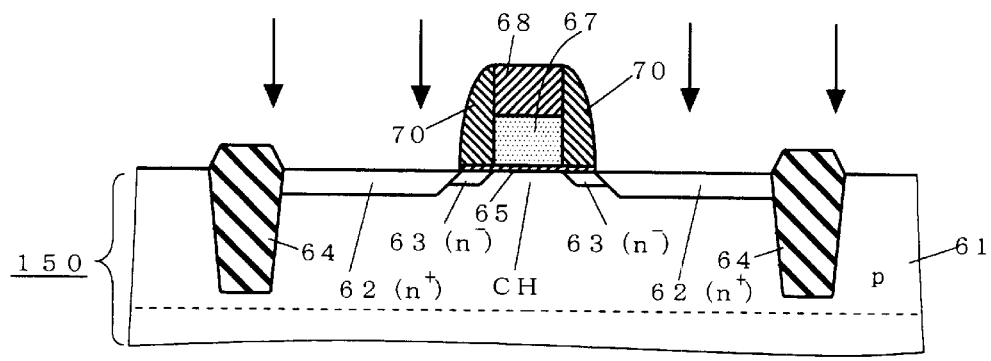
Figure 34:
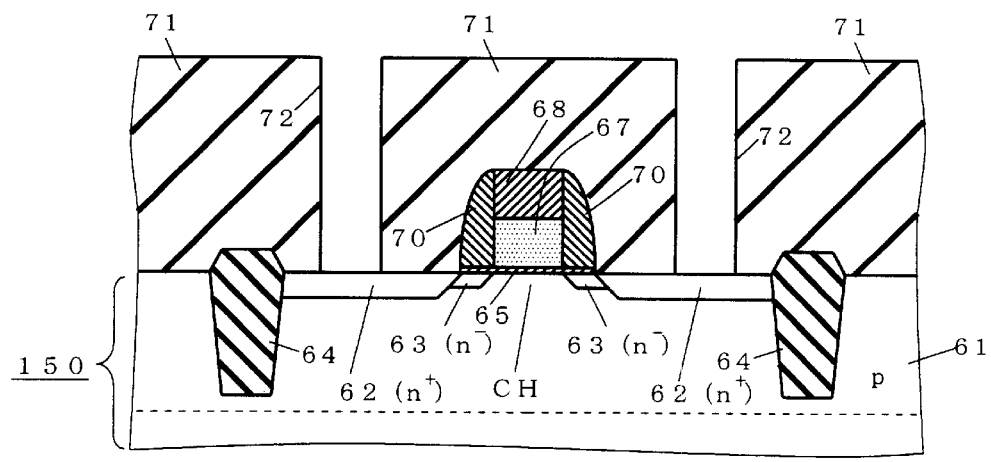
Figure 35:
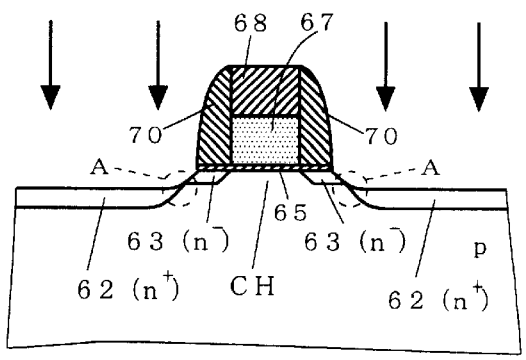

Next, a step of FIG. 28 is executed. In the step of FIG. 28, the storage node 45 is so formed on the insulating layer 42 as to be connected to the main electrode 13. After that, the cell plate insulating film 46 is so formed as to cover the storage node 45 and then the cell plate electrode 47 is formed thereon.

Referring back to FIG. 21, the insulating layer 48 is so deposited as to entirely cover the surface of the cell plate electrode 47 and then the interconnection layer 49 is placed on the insulating layer 48. Through the above steps, the device 105 is completed. Steps after that of FIG. 28 are conventionally well known as a method of manufacturing a DRAM, and detailed discussion will be omitted.

<6. Variation>

Though the semiconductor device comprises an n-channel MOSFET in the above preferred embodiments, a device comprising a p-channel MOSFET can be also provided in like manner.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
    a semiconductor substrate comprising a major surface of a first conductivity type, a pair of low-concentration semiconductor layers of a second conductivity type selectively formed in said major surface separately from each other and a pair of high-concentration semiconductor layers of the second conductivity type selectively formed in said major surface separately from each other, having opposed edges recessed from opposed edges of said pair of low-concentration semiconductor layers, being deeper and higher in concentration then said pair of low-concentration semiconductor layers;

a first insulating film formed immediately on said major surface;

a gate electrode so formed on said first insulating film as to face a region between said opposed edges of said pair of low-concentration semiconductor layers;

a pair of main electrodes connected to said pair of high-concentration semiconductor layers, respectively;

insulating sidewalls covering opposed sides of said gate electrode and each extending a sidewall distance from a corresponding opposed side of the gate electrode over a portion of said first insulating film adjacent to said gate electrode; and a second insulating film whose main component is different from that of said insulating sidewalls, extending over a top surface of said gate electrode and down along each said opposed side of said gate electrode so as to isolate said gate electrode from said insulating sidewalls, said second insulating film further extending said sidewall distance over said portion of said first insulating film so as to isolate said first insulating film from said insulating sidewalls and not as to extend off said sidewalls.

2. The semiconductor device according to claim 1, further comprising:

a third insulating film whose main component is different from that of said second insulating film, said third insulating film being formed at least under said second insulating film so as to isolate said gate electrode from said second insulating film, isolating said first insulating film from said second insulating film and covering said upper portion of said first insulating film not facing said gate electrode.

3. The semiconductor device according to claim 2 further comprising:

an insulating layer formed above said major surface and selectively defining a pair of contact holes which said pair of main electrodes penetrate respectively, wherein said first insulating film, said third insulating film and said insulating layer include the same main component.

4. The semiconductor device according to claim 3, wherein said semiconductor substrate includes silicon as its main component, said insulating sidewalls, said first insulating film, said third insulating film and said insulating layer include silicon oxide as their main component, and said second insulating film includes silicon nitride as its main component.

5. A semiconductor device, comprising:

a semiconductor substrate comprising a major surface of a first conductivity type, a pair of low-concentration semiconductor layers of a second conductivity type selectively formed in said major surface separately from each other and a pair of high-concentration semiconductor layers of the second conductivity type selectively formed in said major surface separately from each other, having opposed edges recessed from opposed edges of said pair of low-concentration semiconductor layers, being deeper and higher in concentration than said pair of low-concentration semiconductor layers;

a first insulating film formed immediately on said major surface;

a gate electrode formed on said first insulating film facing a region between said opposed edges of said pair of low-concentration semiconductor layers;

a pair of main electrodes connected to said pair of high-concentration semiconductor layers, respectively;

insulating sidewalls covering at least opposed sides of said gate electrode and a portion of said first insulating film adjacent to said opposed sides of said gate electrode;

a second insulating film interposed between at least said opposed sides of said insulating sidewalls and said gate electrode;

a third insulating film whose main component is different from that of said insulating sidewalls, interposed between said insulating sidewalls and said first insulating film;

an insulating layer formed above said major surface and selectively defining a pair of contact holes which said pair of main electrodes penetrate, respectively, wherein said first insulating film, said third insulating film and said insulating layer include the same main component, and wherein said semiconductor substrate includes silicon as its main component, said first insulating film, said third insulating film and said insulating layer include silicon oxide as their main component, and said second insulating film includes a layer including silicon nitride as its main component at least on a side facing said gate electrode.

6. A semiconductor device, comprising:

a semiconductor substrate comprising a major surface of a first conductivity type, a pair of low-concentration semiconductor layers of a second conductivity type selectively formed in said major surface separately from each other and a pair of high-concentration semiconductor layers of the second conductivity type selectively formed in said major surface separately from each other, having opposed edges recessed from opposed edges of said pair of low-concentration semiconductor layers, being deeper and higher in concentration than said pair of low-concentration semiconductor layers;

a first insulating film formed immediately on said major surface;

a gate electrode formed on said first insulating film facing a region between said opposed edges of said pair of low-concentration semiconductor layers;

a pair of main electrodes connected to said pair of high-concentration semiconductor layers, respectively;

insulating sidewalls covering at least opposed sides of said gate electrode and a portion of said first insulating film adjacent to said opposed sides of said gate electrode;

a second insulating film interposed between at least said opposed sides of said insulating sidewalls and said gate electrode;

a third insulating film whose main component is different from that of said insulating sidewalls, interposed between said insulating sidewalls and said first insulating film;

a first insulating layer formed on said gate electrode; and a second insulating layer whose main component is different from that of said insulating sidewalls and said first insulating film, formed above said major surface and selectively defining a pair of contact holes which said pair of main electrodes penetrate, respectively.

7. The semiconductor device according to claim 6, wherein said pair of contact holes are formed with spacing narrower than the width of said gate electrode along a direction from one of said pair of low-concentration semiconductor layers to the other.

8. The semiconductor device according to claim 5, wherein said second insulating film includes a layer including silicon oxide as its main component at least on a side not facing said gate electrode.

9. The semiconductor device according to claim 6, wherein said first insulating film, said third insulating film and said second insulating layer include the same main component.

* * * * *